United States Patent
Oya et al.

(10) Patent No.: US 10,025,291 B2
(45) Date of Patent: Jul. 17, 2018

(54) SIMULATOR, SIMULATION METHOD, AND SIMULATION PROGRAM

(71) Applicant: OMRON Corporation, Kyoto-shi, Kyoto (JP)

(72) Inventors: Taku Oya, Kyoto (JP); Fumiaki Narutani, Kusatsu (JP); Yasunori Sakaguchi, Takatsuki (JP); Haruna Shimakawa, Kyoto (JP)

(73) Assignee: OMRON Corporation, Kyoto-shi (JP)

( * ) Notice: Subject to any disclaimer, the term of this patent is extended or adjusted under 35 U.S.C. 154(b) by 0 days.

(21) Appl. No.: 15/590,051

(22) Filed: May 9, 2017

(65) Prior Publication Data
US 2017/0242423 A1    Aug. 24, 2017

Related U.S. Application Data

(63) Continuation of application No. 14/385,172, filed as application No. PCT/JP2013/054157 on Feb. 20, 2013, now Pat. No. 9,679,405.

(30) Foreign Application Priority Data

Mar. 15, 2012  (JP) ................................. 2012-058273

(51) Int. Cl.
*B25J 13/08*    (2006.01)
*B25J 9/16*    (2006.01)
(Continued)

(52) U.S. Cl.
CPC ........ *G05B 19/4069* (2013.01); *B25J 9/1605* (2013.01); *B25J 13/08* (2013.01);
(Continued)

(58) Field of Classification Search
None
See application file for complete search history.

(56) References Cited

U.S. PATENT DOCUMENTS

| 2003/0030658 A1* | 2/2003 | Gibbs | H04N 21/21805 715/700 |
| 2007/0213874 A1* | 9/2007 | Oumi | B25J 9/1697 700/245 |
| 2008/0059131 A1* | 3/2008 | Tokita | G06F 3/011 703/5 |

OTHER PUBLICATIONS

Kenneth Salisbury, Francois Conti, and Federico Barbagli, "Haptic Rendering: Introductory Concepts", IEEE Computer Graphics and Applications, Jan./Feb. 2004, pp. 24-32.*

* cited by examiner

*Primary Examiner* — Yingchun He
(74) *Attorney, Agent, or Firm* — Metrolexis Law Group, PLLC

(57) ABSTRACT

One or more embodiments may provide a simulator for reproducing, in a virtual space, a motion of a machine that is controlled by a control program to manipulate an object. The simulator includes a processor configured with a simulation program to perform operations including: determining a condition of the object from a real space image; calculating an initial position of a virtual object in the virtual space corresponding to the determined condition; calculating a command value for moving a virtual machine in the virtual space, according to the control program and based on the position of the virtual object manipulated by the virtual machine in the virtual space, wherein the virtual machine corresponds to the machine; and creating display data for displaying one of: a motion of the virtual machine and a motion of the virtual object that are moved in accordance with the calculated command value.

13 Claims, 12 Drawing Sheets

(51) Int. Cl.
  *G05B 17/02* (2006.01)
  *G05B 19/4069* (2006.01)
  *G05B 19/418* (2006.01)
  *G06F 17/50* (2006.01)
  *G06F 3/00* (2006.01)
  *G06F 3/01* (2006.01)
(52) U.S. Cl.
  CPC ....... *G05B 17/02* (2013.01); *G05B 19/41885* (2013.01); *G06F 3/005* (2013.01); *G06F 3/011* (2013.01); *G06F 17/5009* (2013.01); *G06F 17/5086* (2013.01)

SIMULATOR, SIMULATION METHOD, AND SIMULATION PROGRAM

This application is a continuation of application Ser. No. 14/385,172, filed on Feb. 10, 2015, which is based upon International Application No. PCT/JP2013/054157, filed on Feb. 20, 2013, which claims priority based on the Article 8 of Patent Cooperation Treaty from prior Japanese Patent Applications No. 2012-058273, filed on Mar. 15, 2012, the entire contents of which is incorporated herein by reference.

TECHNICAL FIELD

Background Art

There have been program creation apparatuses configured to create a control program to be used in an image processing device configured to extract measuring results from an image of a test object photographed by a camera (for example, Japanese Unexamined Patent Publication No. 2009-123069, hereinafter, referred to as "Patent Document 1"). The program creation apparatuses can realize off-line simulations by previously saving images photographed by real cameras as registered images and extracting measuring results from the registered images.

PRIOR ART DOCUMENTS

Patent Documents

Patent Document 1: Japanese Unexamined Patent Publication No. 2009-123069

SUMMARY OF THE INVENTION

Problems to be Solved by the Invention

However, the off-line simulation of Patent Document 1 cannot realize a simulation of synchronous operation of measuring results from visual sensors such as cameras and machine control on the same time axis.

The present invention is adapted to solve the above described problem and one of the objects of the present invention is to provide a simulator, a simulation method, and a simulation program which are capable of realizing an integrated simulation that covers a visual sensor.

Means for Solving the Problem

In order to achieve the above described object, according to an aspect of the present invention, a simulator is an apparatus having a control unit configured to perform a simulation of a control program executed in a controller that controls motion of a machine that manipulates an object.

The control unit includes a first calculator configured to calculate a command value for moving a virtual machine according to the control program and based on model data of a virtual object wherein the virtual machine corresponds to the machine which manipulates the object and wherein the virtual object is manipulated by the virtual machine in a virtual space and corresponds to the object manipulated by the machine; a second calculator configured to calculate motion of the virtual machine which is moved in accordance with the command value calculated by the first calculator; a third calculator configured to calculate motion of the virtual object which is moved in accordance with the motion of the virtual machine calculated by the second calculator; and a virtual photographing part configured to generate a virtual space image which is acquired in the case where the motion of the virtual machine calculated by the second calculator or the motion of the virtual object calculated by the third calculator is virtually photographed. The first calculator is configured to calculate the command value further based on the virtual space image generated by the virtual photographing part.

Preferably, the first calculator, the second calculator, the third calculator, and the virtual photographing part respectively calculate the command value, the motion of the virtual machine, and the motion of the virtual object and generate the virtual space image in accordance with the same time axis.

Preferably, the control unit further includes a determination part configured to determine a condition of the object or the machine from a real space image photographed by a visual sensor in a real space corresponding to the virtual photographing part; and a fourth calculator configured to calculate an initial condition of the object or the machine from the condition determined by the determination part. The first calculator is configured to calculate the command value on the assumption that the initial condition calculated by the fourth calculator is a condition at a starting time of the simulation.

Preferably, the simulator further includes a storage part and a display. The storage part includes an image storage part configured to associate the real space image photographed by the visual sensor in the real space corresponding to the virtual photographing part with the virtual space image corresponding to the real space image and to store the associated real space image and virtual space image beforehand. The control unit includes a display controller configured to cause the display to display the real space image where the real space image is stored in the image storage part in association with the virtual space image generated by the virtual photographing part.

According to another aspect of the present invention, a simulation method is a method performed in a simulator including a control unit configured to perform a simulation of a control program executed in a controller that controls motion of a machine that manipulates an object.

In the simulation method, the control unit includes: a first step to calculate a command value for moving a virtual machine according to the control program and based on model data of a virtual object where the virtual machine corresponds to the machine which manipulates the object and the virtual object is manipulated by the virtual machine in a virtual space and corresponds to the object manipulated by the machine; a second step to calculate motion of the virtual machine which is moved in accordance with the command value calculated in the first step; a third step to calculate motion of the virtual object which is moved in accordance with the motion of the virtual machine calculated in the second step; and a virtual photographing step to generate a virtual space image which is acquired in the case where the motion of the virtual machine calculated in the second step or the motion of the virtual object calculated in the third step is virtually photographed. The first step includes a step to calculate the command value based on the virtual space image generated in the virtual photographing step.

According to yet another aspect of the present invention, a simulation program is a program executed in a simulator including a control unit configured to perform a simulation of a control program executed in a controller that controls motion of a machine that manipulates an object.

The simulation program causes the control unit to perform: a first step of calculating a command value for moving a virtual machine according to the control program and based on model data of a virtual object where the virtual machine corresponds to the machine which manipulates the object and the virtual object is manipulated by the virtual machine in a virtual space and corresponds to the object manipulated by the machine; a second step of calculating motion of the virtual machine which is moved in accordance with the command value calculated in the first step; a third step of calculating motion of the virtual object which is moved in accordance with the motion of the virtual machine calculated in the second step; and a virtual photographing step of generating a virtual space image which is acquired in the case where the motion of the virtual machine calculated in the second step or the motion of the virtual object calculated in the third step is virtually photographed. The first step includes a step of calculating the command value based on the virtual space image generated in the virtual photographing step.

Effect of the Invention

According to the present invention, an integrated simulation that covers a visual sensor can be realized. Further, a test in the case where a visual sensor is used in machine control can be carried out.

MODE FOR CARRYING OUT THE INVENTION

Embodiments of the present invention will be described in detail below with reference to the drawings. The same and corresponding parts of the drawings are denoted by the same reference symbols and the description thereof will not be repeated.

First Embodiment

Figure 1:
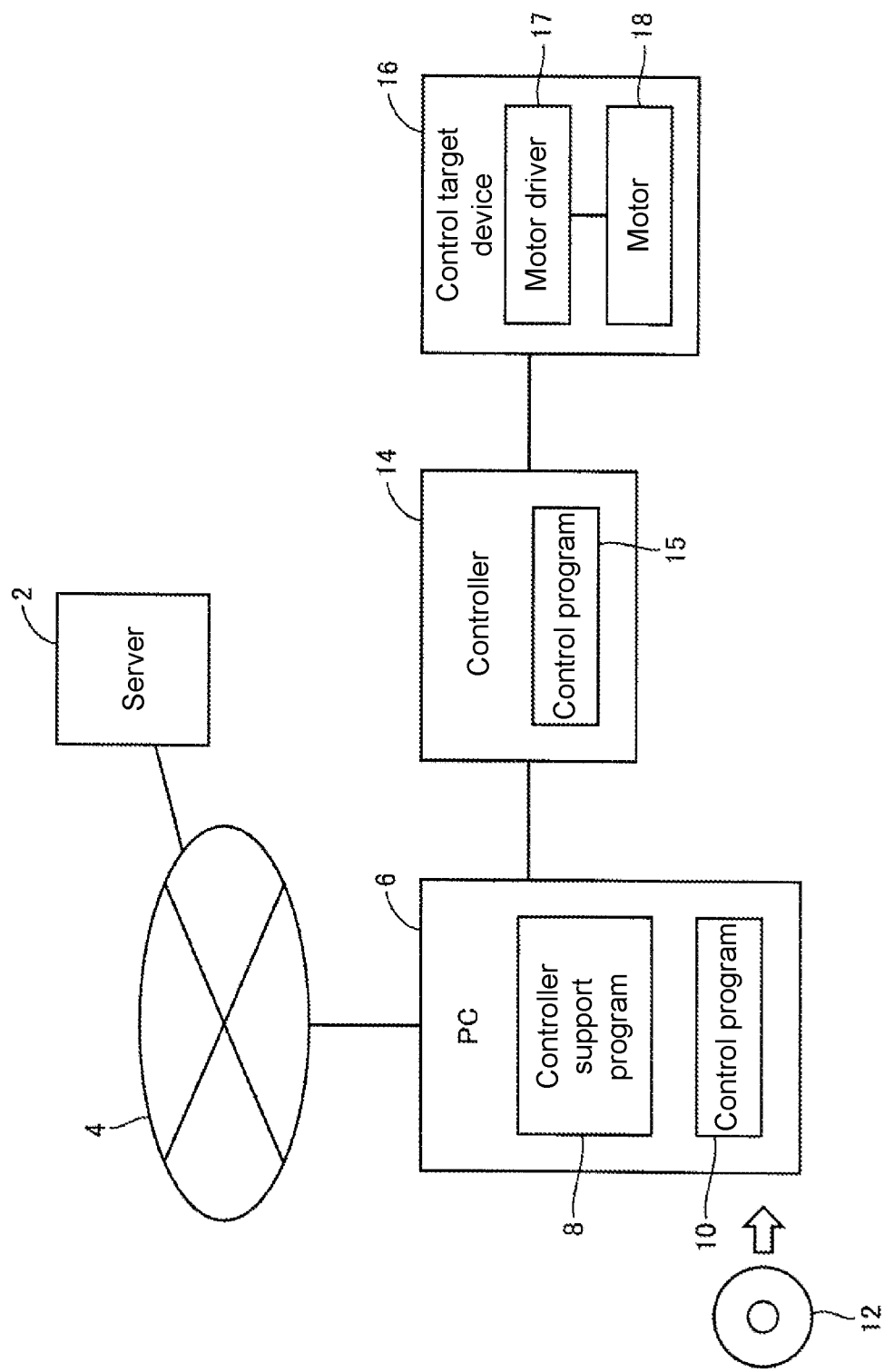
FIG. 1 is a diagram illustrating a configuration of a control system according to an embodiment of the present invention.

FIG. 1 is a diagram illustrating a configuration of a control system according to an embodiment of the present invention. Referring to FIG. 1, the control system according to the embodiment of the present invention includes a server 2, a network 4, a PC (Personal Computer) 6, a controller 14, and a control target device 16.

The server 2 is connected to the PC 6 via the network 4. The PC 6 is communicatively connected to the controller 14 which controls the control target device 16.

The PC 6 is corresponding to the simulator in an embodiment of the present invention. A controller support program 8 including the simulation program is installed in the PC 6 and a control program 10 created by a user is stored in the PC 6. A CD-ROM (Compact Disc-Read Only Memory) 12 stores the controller support program 8. The controller support program 8 installed in the PC 6 has been installed from the CD-ROM 12.

The controller 14 controls operations of the control target device 16. In the embodiment of the present invention, a PLC (Programmable Logic Controller) is used as an example of the controller 14. That is, a so-called motion control function is provided in the PLC. The controller 14 stores a control program 15 that defines details of control exerted on the control target device 16. The controller 14 executes the control program 15 once in each control period. In this embodiment, the control program 15 stored in the controller 14 is copied data of the control program 10 stored in the PC 6 and is transmitted from the PC 6.

The control target device 16 includes a motor 18 such as a servo-motor or a stepper motor, and a motor driver 17 which drives a motor.

The motor 18 receives a driving current supplied from the motor driver 17. The controller 14 which executes the control program 15 provides a command value about a position for the motor driver 17 in each control period, and the motor driver 17 supplies the driving current according to the command value to the motor 18. In the case where the motor 18 is a servo-motor, the motor 18 is provided with an encoder which detects an actual measurement value of rotational position of the motor 18. The actual measurement value of rotational position of the motor is used by the motor driver 17 in feedback control.

Incidentally, although the case where the simulation program is installed in the PC 6 via the CD-ROM 12 has been described above, the present invention is not limited to that and the simulation program may be downloaded from the server 2 via the network 4 to the PC 6. The same applies to the control program.

Figure 2:
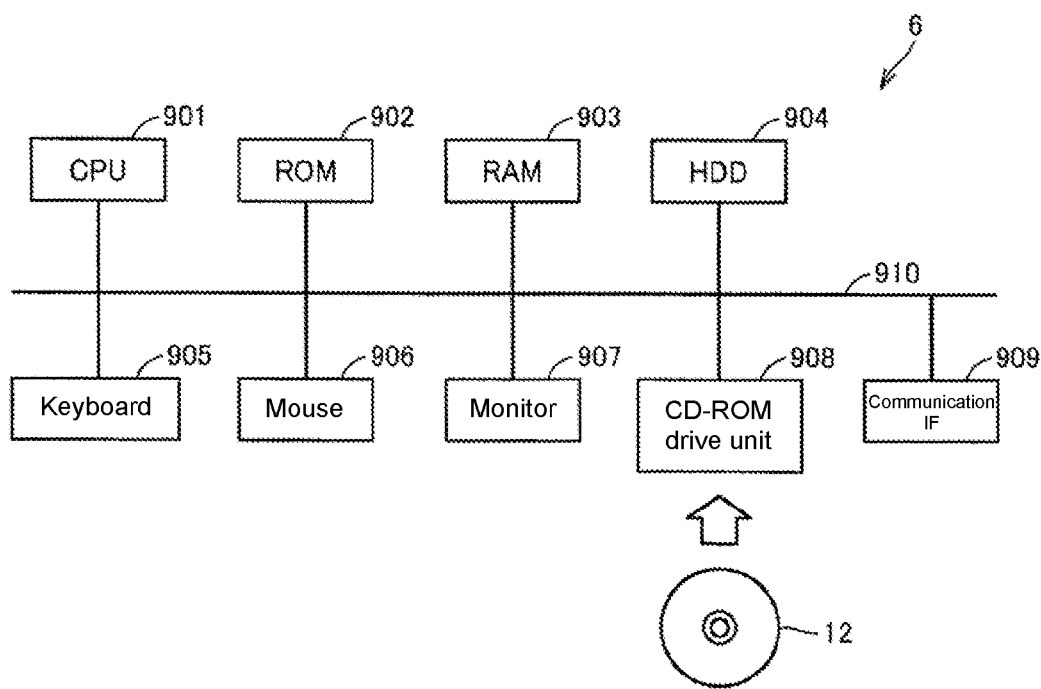
FIG. 2 is a diagram illustrating a hardware configuration of a PC according to the embodiment of the present invention.

FIG. 2 is a diagram illustrating a hardware configuration of the PC 6 according to the embodiment of the present invention. Referring to FIG. 2, the PC 6 according to the embodiment of the present invention includes a CPU 901 which is a processor, a ROM 902, a RAM 903, and an HDD 904 which are storage parts, a CD-ROM drive unit 908 which is a data reader, a communication IF 909 which is a communication part, a monitor 907 which is a display, and a keyboard 905 and a mouse 906 which are input parts. Meanwhile, these components are interconnected via an internal bus 910.

The HDD 904, which is typically a non-volatile magnetic memory, stores the simulation program read out by the CD-ROM drive unit 908 from the CD-ROM 12. The HDD 904 also stores the control program 15.

The CPU 901 loads the controller support program 8 according to the embodiment stored in the HDD 904 into the RAM 903 and executes the controller support program 8.

The RAM 903 is a volatile memory and used as a work memory. The ROM 902 generally stores programs including an operating system (OS).

The communication IFs 909, which typically support general-purpose communication protocols such as Ethernet (Registered Trademark) or USB (Universal Serial Bus), provide data communication between the PC 6 and the server 2 via the network 4 while providing data communication between the PC 6 and the controller 14.

The monitor 907 is constituted of a liquid crystal display device, a CRT (Cathode Ray Tube), a plasma display device, and the like and displays results processed by the PC 6 and the like. The keyboard 905 receives key entries performed by a user, whereas the mouse 906 receives pointing operations performed by the user.

Figure 3:
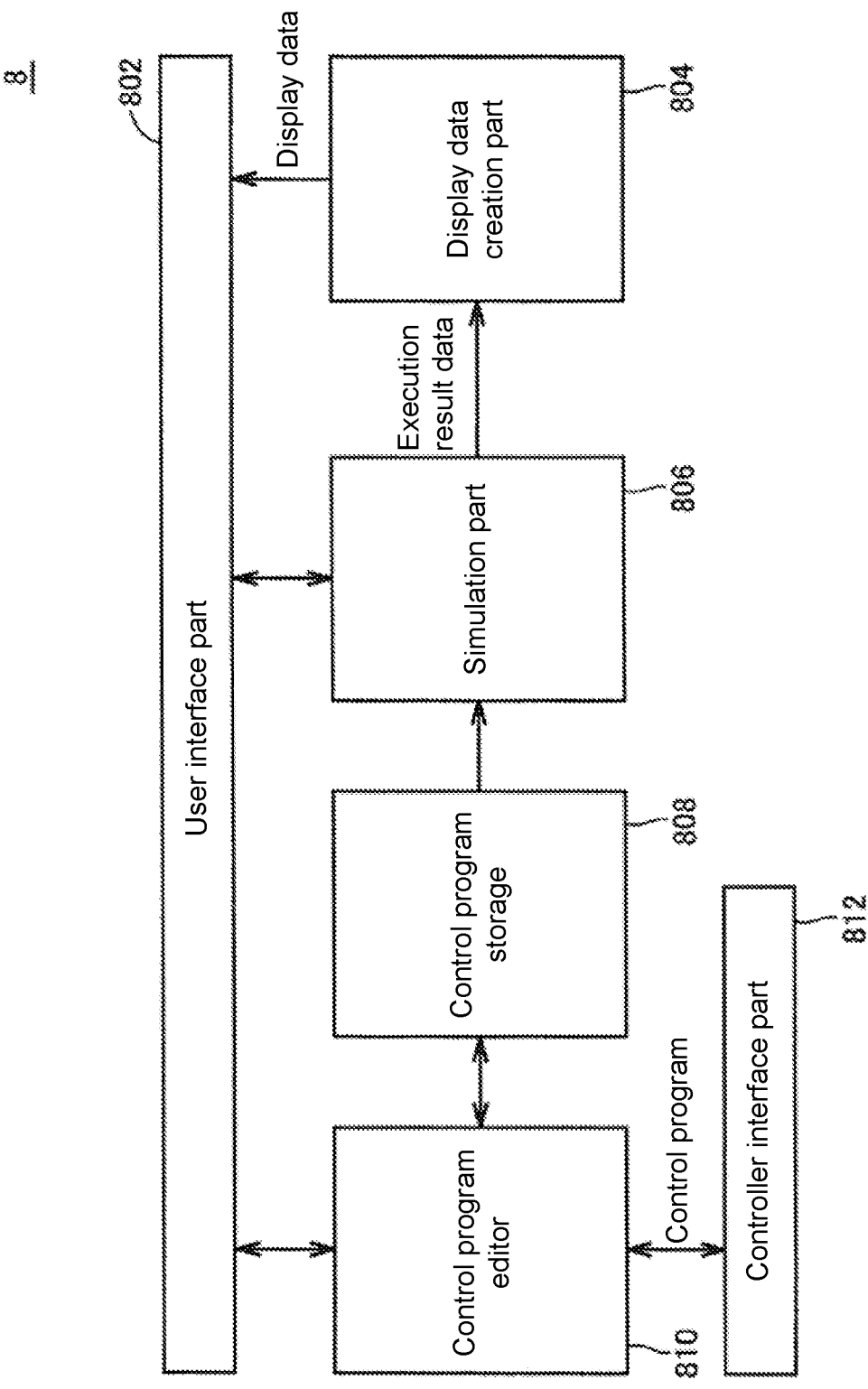
FIG. 3 is a diagram illustrating a functional block realized by a CPU executing a simulation program.

FIG. 3 is a diagram illustrating a functional block realized by the CPU 901 executing the controller support program 8. Referring to FIG. 3, a user interface part 802, a display data creation part 804, a simulation part 806, a control program storage part 808, a control program editor 810, and a controller interface part 812 are illustrated.

The user interface part 802 is a component configured to create contents of a window to be displayed on the monitor 907 of the PC 6 and receive a user operation performed on the keyboard 905 and the mouse 906.

The control program editor 810 allows the user to input and edit the control program. The control program editor 810 is also responsible for compilation in the case where the control program requires to be compiled for execution. The created control program is sent to the controller 14 via the controller interface part 812. Further, the created control program is stored in the control program storage part 808 which is a predetermined area of the HDD 904. The control program editor 810 can also read out the control program 15 stored in the controller 14 via the controller interface part 812 to edit the control program 15.

The simulation part 806 is a simulator of the controller 14. The simulation part 806 simulates operations of the controller 14 executing the control program 15 according to the control program 10 stored in the control program storage part 808 and calculates the command value about the position to be output in each control period from the controller 14.

Further, the simulation part 806 can perform simulations such as a simulation of a situation in which arrival of a signal from outside affects operations of the control program and a simulation of a situation in which execution of the control program 15 changes an internal condition of the controller 14 including contents stored in a memory of the controller 14 and consequently the change affects operations of the control program 15.

Still further, the simulation part 806 receives an instruction from the user about execution of a simulation via the user interface part 802. In other words, the user interface part 802 also functions as a component for receiving an instruction from the user destined to the simulation part 806.

The display data creation part 804 creates display data for displaying a chronological change in execution result data created by the simulation part 806. The display data creation part 804 causes the created display data to be displayed on the monitor 907 of the PC 6 in the forms of graph and text or in the form of 3D representation by sending the created display data to the user interface part 802.

Figure 4:
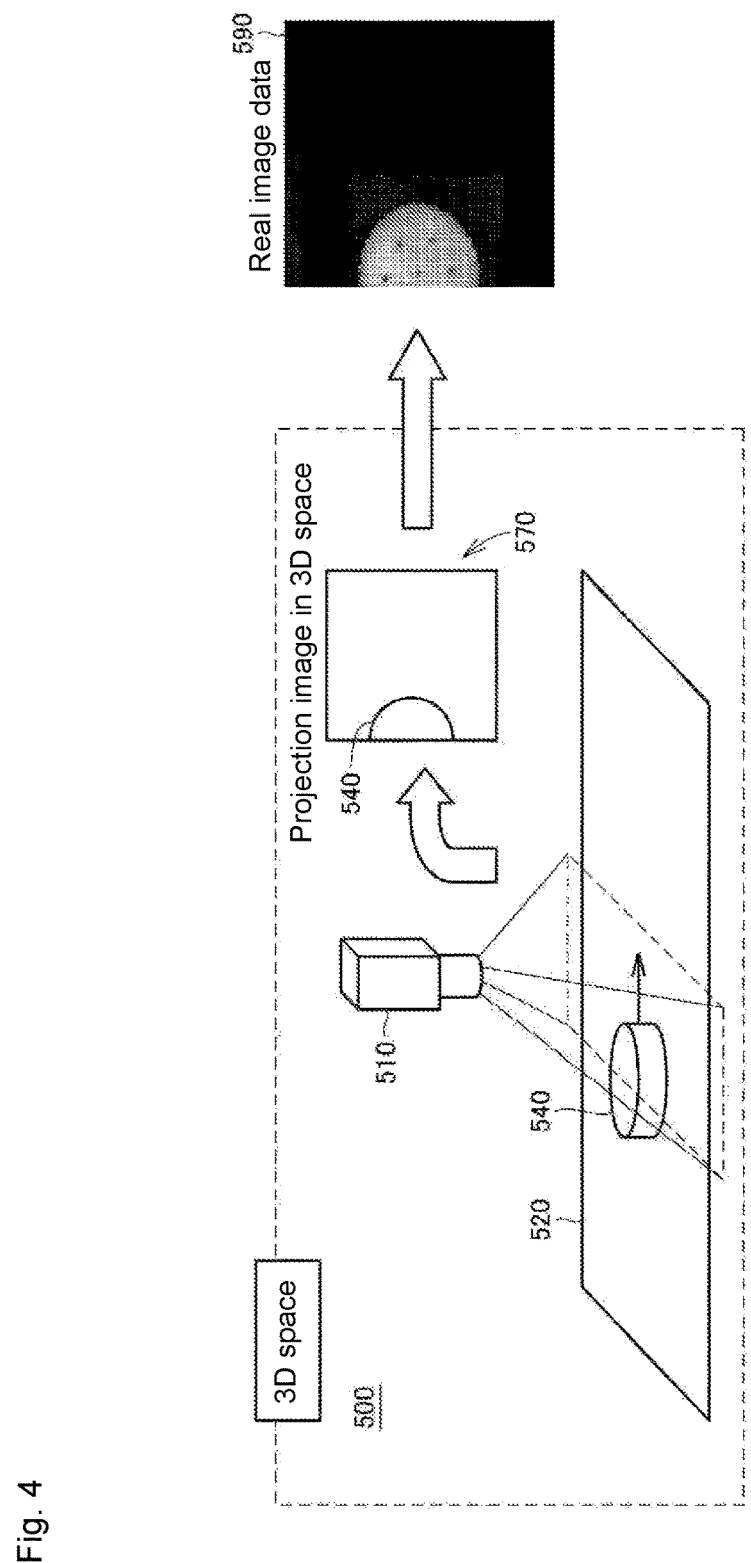
FIG. 4 is a first illustration showing a simulation state in the embodiment of the present invention.

FIG. 4 is a first illustration showing a simulation state in the embodiment of the present invention. Referring to FIG. 4, in the embodiment, a virtual conveyor 520 corresponding to a conveyor in a real space, a virtual visual sensor 510 corresponding to a visual sensor in the real space, and a virtual workpiece 540 corresponding to a workpiece in the real space are arranged in a 3D space 500 which is a virtual space corresponding to the real space.

The simulation part 806 illustrated in FIG. 3 executes a 3D simulator, a visual sensor simulator, and a machine control simulator.

The 3D simulator causes objects (in this embodiment, the virtual visual sensor 510, the virtual conveyor 520, and the virtual workpiece 540) to be displayed in the 3D space 500 based on the result acquired by data trace.

The visual sensor simulator performs image processing on virtual image data 570 of the object acquired in the 3D space 500 (in this embodiment, the virtual workpiece 540) and reflects a determination result of the image processing on control of a virtual machine which is a virtual machine in the 3D space 500 (in this embodiment, the virtual conveyor 520).

The machine control simulator controls the virtual machine which is present in the 3D space 500. Specifically, the machine control simulator calculates the command value for the control of the virtual machine and calculates motion of the virtual machine corresponding to the command value.

Comparing the virtual image data 570 with a real image data 590 realizes synchronization of the 3D simulator, the visual sensor simulator, and the machine control simulator.

Specifically, as one of methods of comparing the virtual image data 570 with the real image data 590, there is a method of combining image processing that is for extracting a contour of a workpiece (object) from the virtual image data 570 and a contour of a workpiece (object) from the real image data 590 with processes of comparing the extracted two sets of contours with each other and determining whether the contours fit with each other. Further, there is a method of combining a process of converting the real image data 590 into a gray-scale image by removing color data from the real image data 590 with processes of calculating approximate values of the gray-scale image after the conversion and the virtual image data 570 and determining whether the approximate values agree with each other.

Alternatively, as one of methods of synchronizing the 3D simulator, the visual sensor simulator, and the machine control simulator by using a result of comparison of the virtual image data 570 with the real image data 590, there is a method of causing the 3D simulator, the visual sensor simulator, and the machine control simulator to function in conjunction with each other such that (1) the machine control simulator issues a photographing instruction, (2) the visual sensor simulator responds to the photographing instruction by issuing a request to acquire the virtual image data 570 in the 3D space 500, (3) the 3D simulator responds to the acquisition request by sending the virtual image data 570 of a predetermined photographing position, (4) the visual sensor simulator recognizes a workpiece position by using the result of comparison of the virtual image data 570 with the real image data 590 based on the received virtual image data 570 and sends the recognized workpiece position, and (5) the machine control simulator controls the virtual machine based on the received workpiece position.

Figure 5:
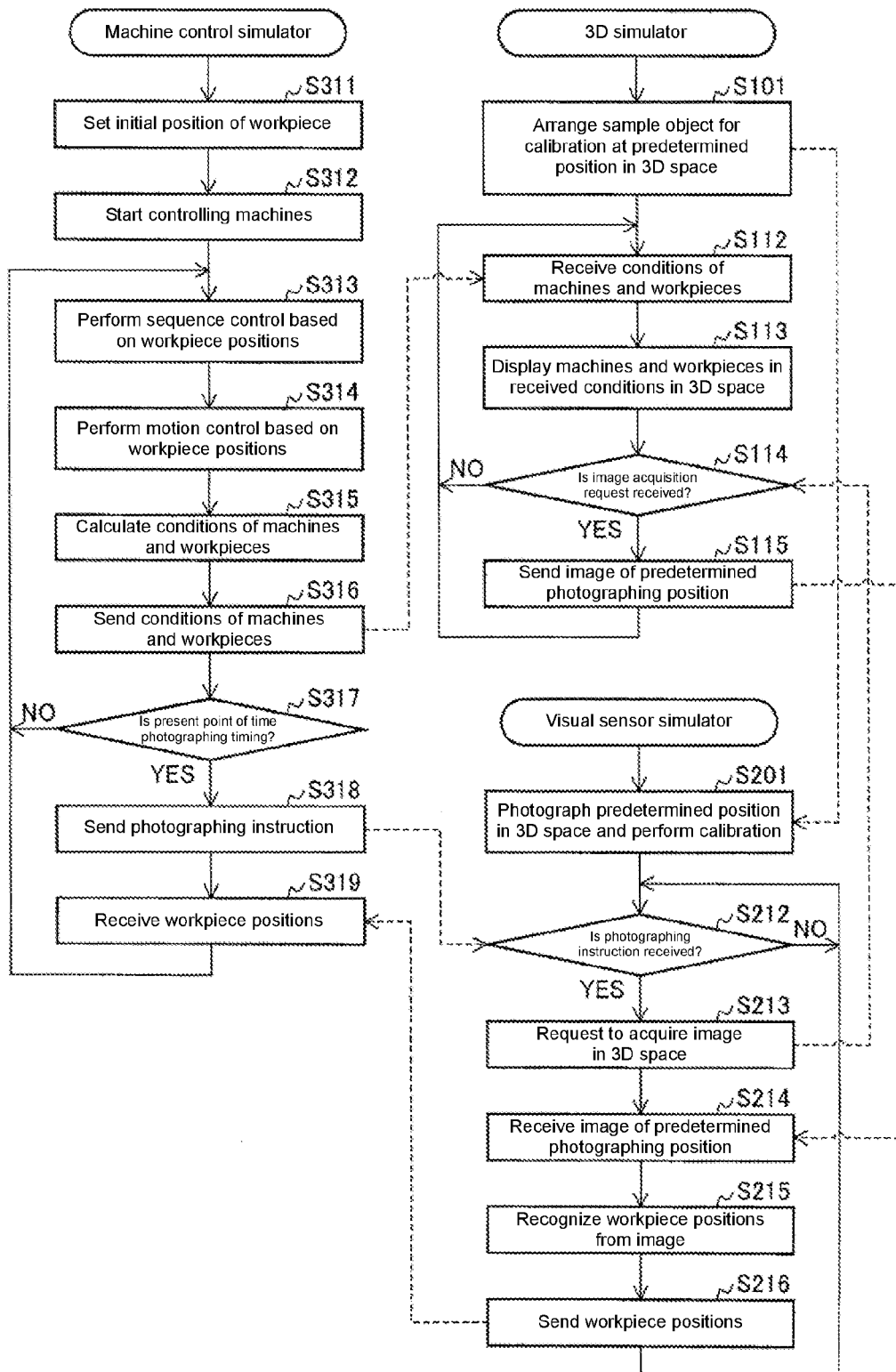
FIG. 5 is a flow chart showing a control flow of the simulation in the first embodiment.

FIG. 5 is a flow chart showing a control flow of the simulation in the first embodiment. Referring to FIG. 5, in step S101, the simulation part 806 virtually arranges a sample object for calibration at a predetermined calibration position in the 3D space 500 by executing the 3D simulator.

In step S201, by executing visual sensor simulator, the simulation part 806 virtually photographs the sample object arranged at the predetermined calibration position in the 3D space 500 with the 3D simulator and performs calibration. In the calibration, whether a photographed image the same as a previously saved image of a predetermined sample object can be obtained or not is confirmed and in the case where a photographed image the same as the previously saved image cannot be obtained, the range of image to be obtained and the like are adjusted so that a photographed image the same as the previously saved image can be obtained.

Then in step S311, the simulation part 806 sets an initial position of a workpiece by executing the machine control simulator.

Figure 6:
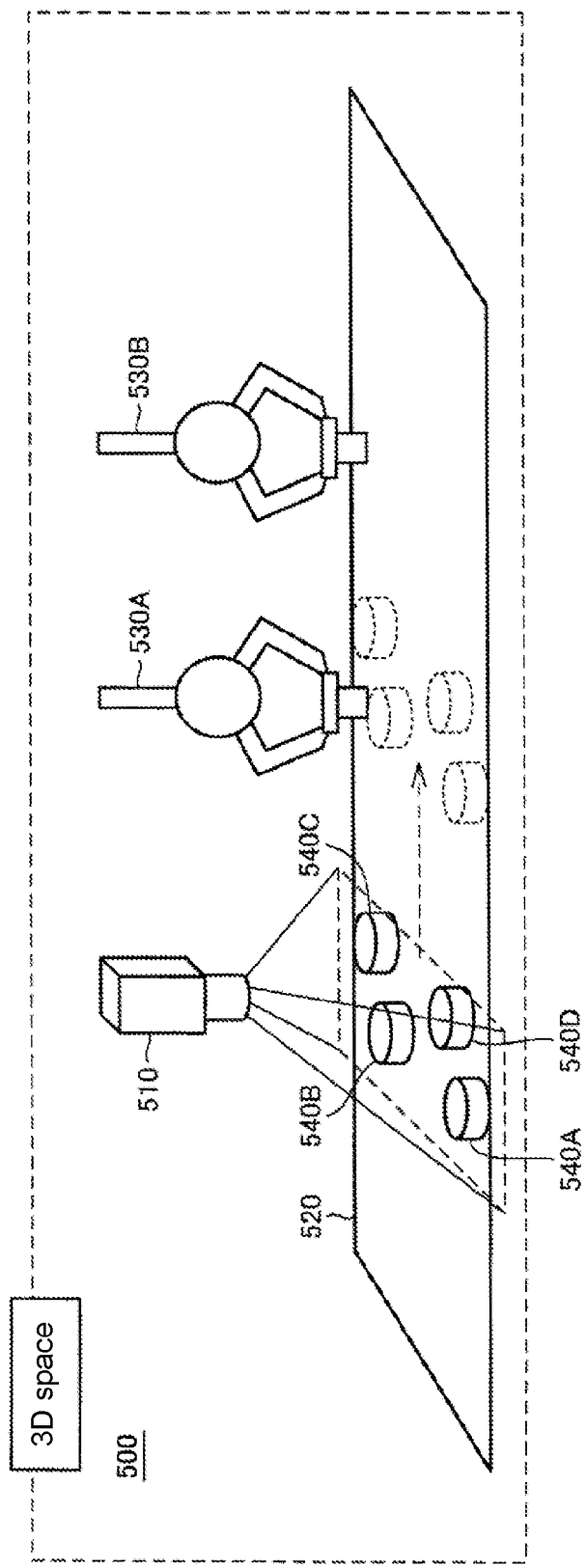
FIG. 6 is a diagram illustrating a 3D space of the simulation in the first embodiment.

FIG. 6 is a diagram illustrating the 3D space 500 of the simulation in the first embodiment. Referring to FIG. 6, in the embodiment, virtual workpieces 540A-540D are set on the virtual conveyor 520, and as a result that a belt of the virtual conveyor 520 is driven, the virtual workpieces 540A-540D move from the left to the right-hand side in FIG. 6 to be handled by virtual robots 530A and 530B in the 3D space 500 corresponding to robots in a real space. Further, the virtual workpieces 540A-540D are photographed by the virtual visual sensor 510.

The initial positions of the virtual workpieces 540A-540D are set on the virtual conveyor 520 on the left of the virtual workpieces 540A-540D which are illustrated in solid lines in the drawing.

Returning to FIG. 5, next in step S312, by executing the machine control simulator, the simulation part 806 starts controlling the virtual machines (in this embodiment, the virtual conveyor 520, the virtual robots 530A and 530B) by starting execution of the control program 15.

In step S313, the simulation part 806 performs sequence control based on the positions of the workpieces. In step S314, the simulation part 806 performs motion control based on the positions of the workpieces.

Then in step S315, the simulation part 806 calculates conditions of the machines and the workpieces resulting from the motion control, and in step S316, the simulation part 806 sends the calculated conditions of the machines and the workpieces to the 3D simulator.

Next in step S112, by executing the 3D simulator, the simulation part 806 receives the conditions of the machines and the workpieces sent from the machine control simulator, and in step S113, execution result data which is necessary to cause the machines and the workpieces in the received conditions to be displayed in the 3D space 500 of the monitor 907 is sent to the display data creation part 804.

Referring to FIG. 6 again, as a result of the sequence control and the motion control performed, the virtual workpieces 540A-540D are carried rightward by the virtual conveyor 520 and lifted up and set at other places by the virtual robots 530A and 530B. That situation is displayed on the monitor 907 as illustrated in FIG. 6.

Returning to FIG. 5, next, the simulation part 806 determines whether the present point in time is photographing timing or not by executing the machine control simulator. In FIG. 6, as a result of determination of whether a current position of an encoder shaft of the virtual conveyor 520 has reached a specified position or not, it is determined whether the present point in time is photographing timing or not. Alternatively, a virtual photoelectric tube sensor may be separately provided so that the photographing timing is decided as a moment when the virtual workpiece blocks an optical axis.

In the case where it is determined that the present point in time is not the photographing timing (in the case where it is determined NO in step S317), the simulation part 806 returns the process to be performed to the process of step S313.

On the other hand, in the case where it is determined that the present point in time is the photographing timing (in the case where it is determined YES in step S317), in step S318, the simulation part 806 sends a photographing instruction to the visual sensor simulator.

In step S212, by executing the visual sensor simulator, the simulation part 806 determines whether the photographing instruction sent from the machine control simulator is received or not. In the case where it is determined that the photographing instruction is not received (in the case where it is determined NO in step S212), the simulation part 806 repeats the process of step S212.

On the other hand, in the case where it is determined that the photographing instruction is received (in the case where it is determined YES in step S212), in step S213, by executing the visual sensor simulator, the simulation part 806 sends an image acquisition request to acquire the virtual image data 570 in the 3D space 500 to the 3D simulator.

In step S114, by executing the 3D simulator, the simulation part 806 determines whether the image acquisition request sent from the visual sensor simulator is received or not. In the case where it is determined that the image acquisition request is not received (in the case where it is determined NO in step S114), the simulation part 806 returns the process to be performed to the process of step S112.

On the other hand, in the case where it is determined that the image acquisition request is received (in the case where it is determined YES in step S114), in step S115, the simulation part 806 sends the virtual image data 570 of a predetermined photographing position to the visual sensor simulator. The predetermined photographing position refers to a position in the 3D space 500 corresponding to a position in the real space at which the visual sensor in the real space corresponding to the virtual visual sensor 510 is aimed. After step S115, the simulation part 806 returns the process to be performed to the process of step S112.

In step S214, by executing the visual sensor simulator, the simulation part 806 receives the virtual image data 570 of a predetermined photographing position sent from the 3D simulator.

Next in step S215, by executing the visual sensor simulator, the simulation part 806 recognizes the workpiece positions from the virtual image data 570, and in step S216, the simulation part 806 sends the recognized workpiece positions to the machine control simulator and returns the process to be performed to the process of step S212.

In step S319, by executing the machine control simulator, the simulation part 806 receives the workpiece positions sent from the visual sensor simulator and returns the process to be performed to the process of step S313. Based on the received workpiece positions, the above described processes of step S313 and step S314 are performed.

Referring to FIG. 6 again, the virtual robots 530A and 530B pick up the virtual workpieces 540A-540D based on the positions of the virtual workpieces 540A-540D recognized from the virtual image data 570 from the virtual visual sensor 510 and set the virtual workpieces 540A-540D at other places, for example.

Figure 7:
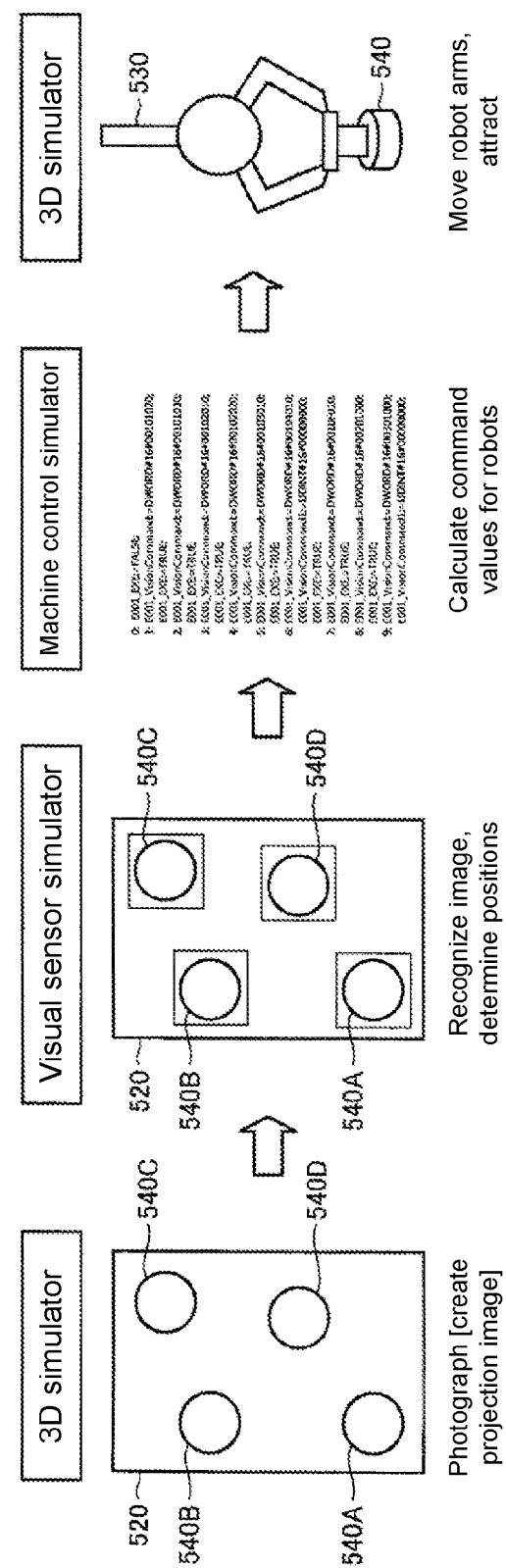
FIG. 7 is a diagram for describing a control based on positions of virtual workpieces recognized by a virtual visual sensor in the first embodiment.

FIG. 7 is a diagram for describing a control based on the positions of the virtual workpieces 540A-540D recognized by the virtual visual sensor 510 in the first embodiment. Referring to FIG. 7, as a result of step S115 of the 3D simulator in FIG. 5 executed, the virtual image data 570 that is assumed to be photographed by the virtual visual sensor 510 is created. In the virtual image data 570, a situation in which the virtual workpieces 540A-540D are set on the virtual conveyor 520 is photographed.

Then, as a result of step S215 of the visual sensor simulator in FIG. 5 executed, the virtual image data 570 is recognized and the positions of the virtual workpieces 540A-540D are determined.

Next, as a result of step S313 and step S314 of the machine control simulator in FIG. 5 executed, the command values for the virtual robots 530A and 530B are calculated and the motion control is performed.

Then, as a result of step S113 of the 3D simulator in FIG. 5 executed, a situation in which the virtual workpieces 540A-540D are being handled by the virtual robots 530A and 530B is displayed in the 3D space 500 of the monitor 907.

Second Embodiment

Figure 8:
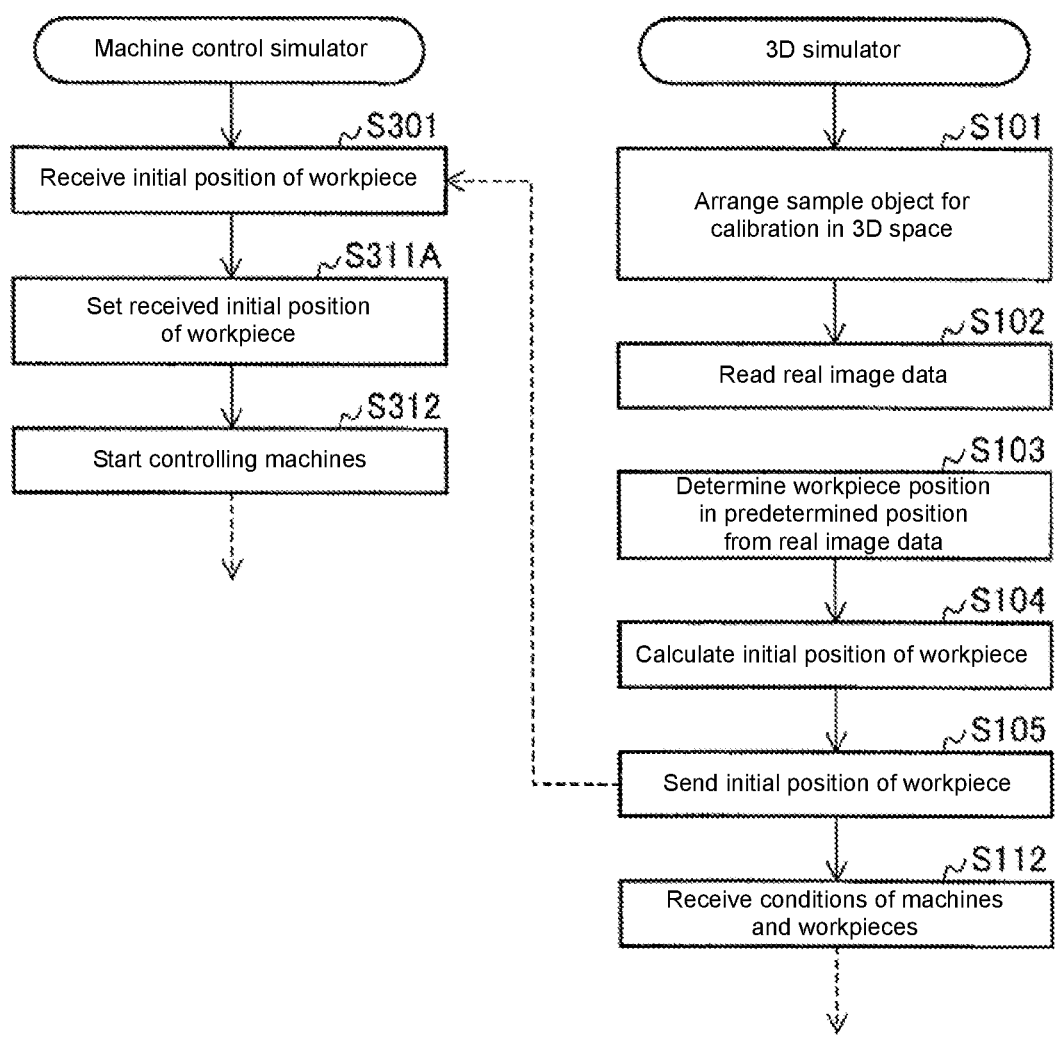
FIG. 8 is a flow chart showing a control flow of the simulation in a second embodiment.

FIG. 8 is a flow chart showing a control flow of the simulation in the second embodiment. Referring to FIG. 8, in the second embodiment, after step S101 described in FIG. 5 of the first embodiment, in step S102, by executing the 3D simulator, the simulation part 806 reads the real image data 590 of a predetermined photographing position photographed by the visual sensor in the real space corresponding to the virtual visual sensor 510.

Next in step S103, the simulation part 806 determines the workpiece position in a predetermined photographing position (in this embodiment, a position at which the virtual visual sensor 510 is aimed in the 3D space 500, and a position at which the visual sensor is aimed in the real space) from the read real image data 590.

Figure 9:
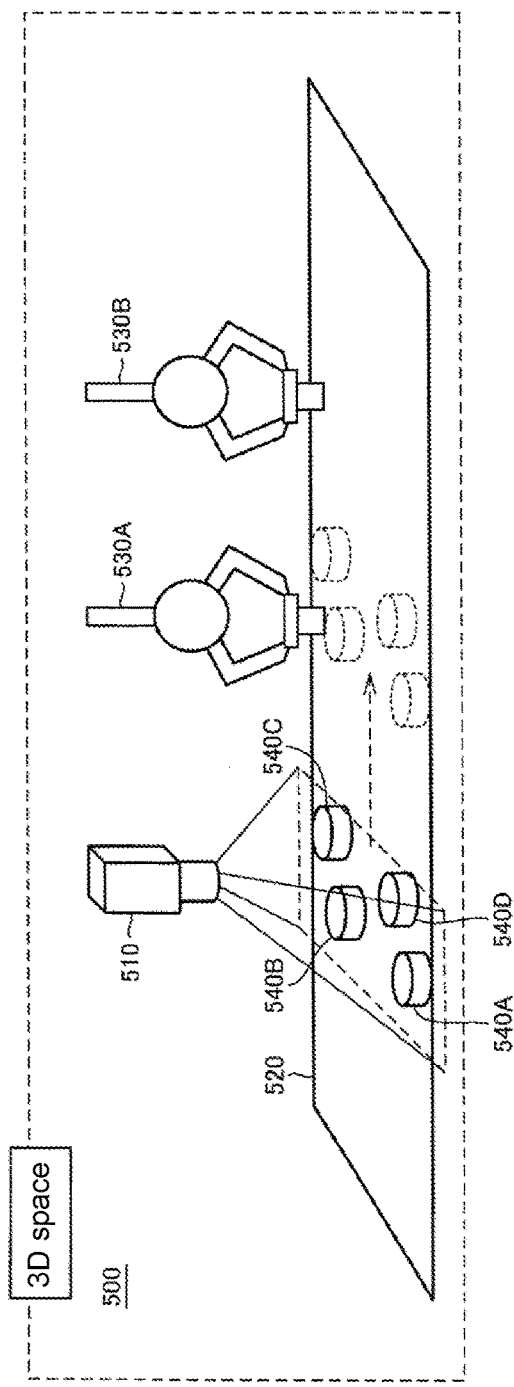
FIG. 9 is a diagram illustrating a 3D space of the simulation in the second embodiment.

FIG. 9 is a diagram illustrating the 3D space 500 of the simulation in the second embodiment. Referring to FIG. 9, the predetermined photographing position of the virtual visual sensor 510 (in the drawing, the part surrounded by a dashed parallelogram) is determined from the real image data 590 corresponding to the virtual image data 570.

Returning to FIG. 8, in step S104, the simulation part 806 calculates the initial position of the workpiece from the position of the workpiece determined in step S103. The initial position of the workpiece may be a position determined from the real image data 590 or a position previous to the position determined from the real image data 590.

Then, in step S105, the simulation part 806 sends the initial position of the workpiece calculated in step S104 to the machine control simulator. Since the processes of step S112 onward after step S105 are the same as the processes in FIG. 5 of the first embodiment, redundant description of the processes will not be repeated.

Next, by executing the machine control simulator, in step S301, the simulation part 806 receives the initial position of the workpiece sent from the 3D simulator, and in step S311A, the simulation part 806 sets the received initial position of the workpiece as an initial position of the workpiece to be simulated. Since the processes of step S312 onward after step S311A are the same as the processes in FIG. 5 of the first embodiment, redundant description of the processes will not be repeated.

Consequently, as a result of execution of the simulation from the position based on the real image data 590, a situation in the real space can be reproduced. Further, in the case where the real image data 590 read in step S102 is the real image data 590 on the occurrence of a trouble, the situation on the occurrence of the trouble can be reproduced. For example, in the case where the real image data 590 of a failure in lifting up of a workpiece is read in, a situation of the failure in lifting up of the workpiece can be reproduced.

Figure 10:
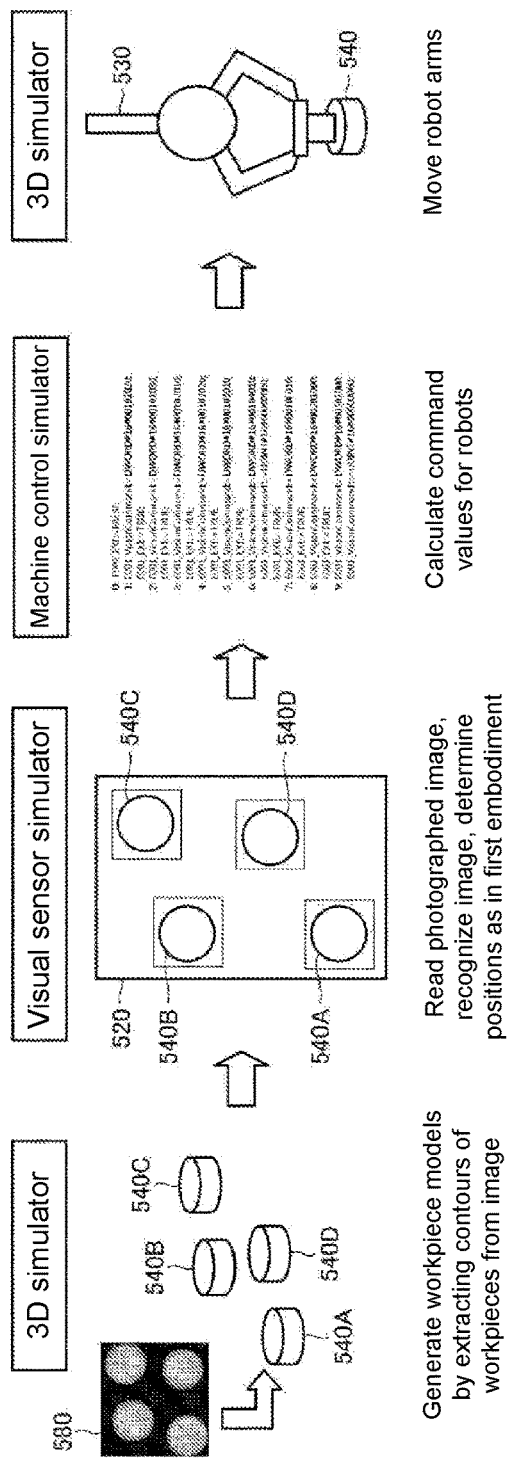
FIG. 10 is a diagram for describing a control based on positions of virtual workpieces recognized by the virtual visual sensor in the second embodiment.

FIG. 10 is a diagram for describing a control based on the positions of the virtual workpieces 540A-540D recognized by the virtual visual sensor 510 in the second embodiment. Referring to FIG. 10, as a result of step S103 and step S104 of the 3D simulator in FIG. 8 executed, contours of the workpieces are extracted from the real image data 590 so that workpiece models including positions and a shape of the workpieces are determined and generated. Since the flow onward is the same as the flow in the first embodiment described with reference to FIG. 7, redundant description of the flow will not be repeated.

Third Embodiment

Figure 11:
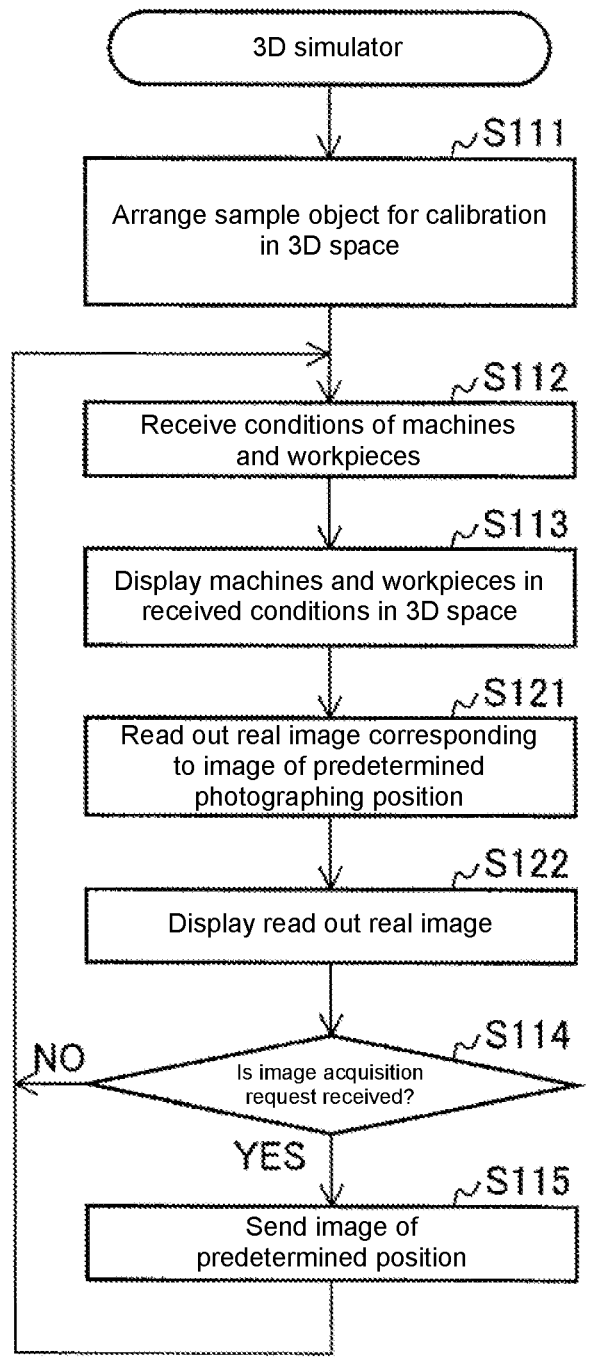
FIG. 11 is a flow chart showing a control flow of the simulation in a third embodiment.

FIG. 11 is a flow chart showing a control flow of the simulation in the third embodiment. Referring to FIG. 11, in the third embodiment, after step S113 described in FIG. 5 of the first embodiment, in step S121, by executing the 3D simulator, the simulation part 806 reads the real image data 590, which is corresponding to image data approximating to the virtual image data 570 of a predetermined photographing position in the 3D space 500 corresponding to a position at which the visual sensor in the real space is aimed, out from the HDD 904. Incidentally, the virtual image data 570 in the 3D space 500 and the corresponding real image data 590 in the real space are associated with each other and stored beforehand in the HDD 904.

Next in step S122, the simulation part 806 sends the real image data 590 which is necessary to cause the real image represented by the real image data 590 read out in step S121 to be displayed on the monitor 907 to the display data creation part 804. Since the loop processes from step S112 to step S115 including step S122 are executed in a very short period (for example, by a few milliseconds to by tens of milliseconds), the real image is displayed as a moving image on the monitor 907. Since the processes of step S114 onward after step S122 are the same as the processes in FIG. 5 of the first embodiment, redundant description of the processes will not be repeated.

Figure 12:
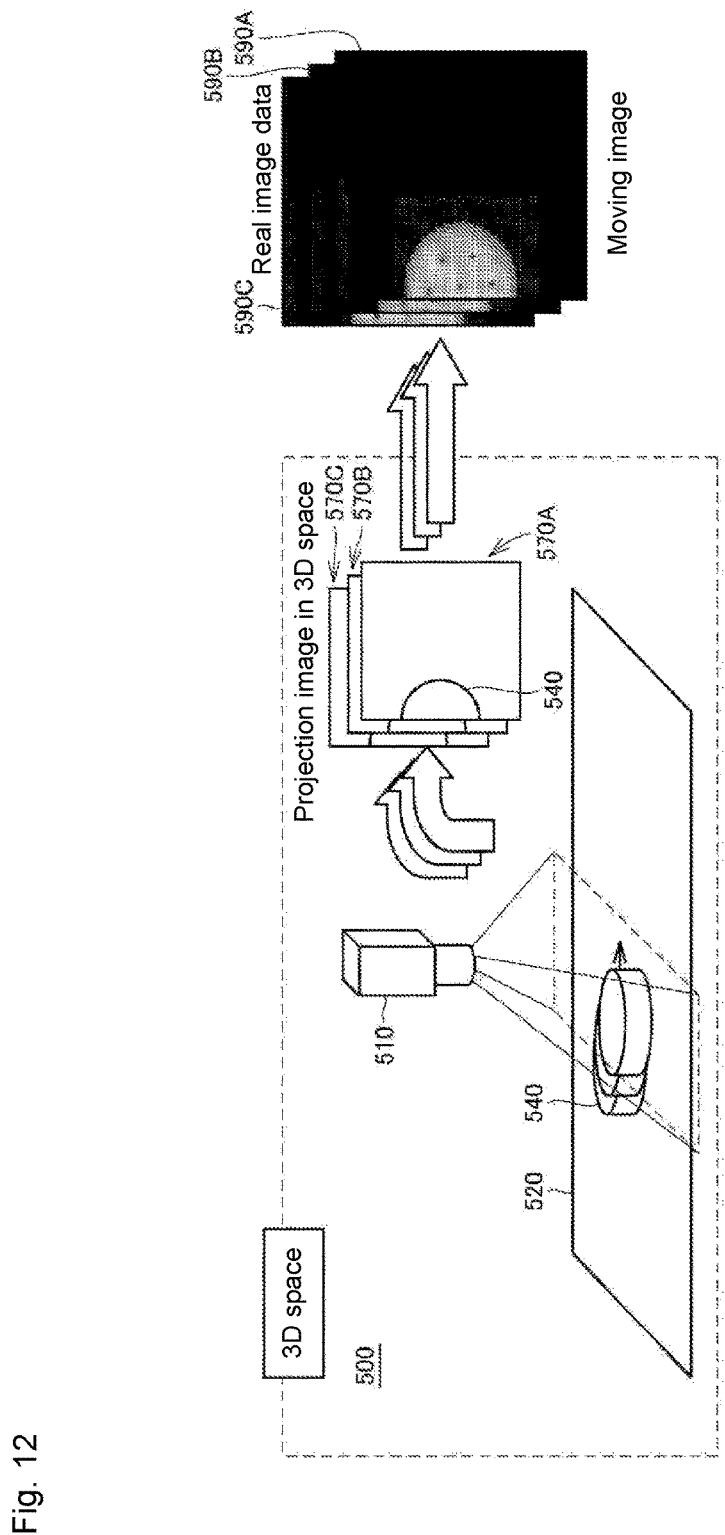
FIG. 12 is a diagram illustrating a 3D space of the simulation in the third embodiment.

FIG. 12 is a diagram illustrating the 3D space 500 of the simulation in the third embodiment. Referring to FIG. 12, as illustrated in the drawing, the real image data 590A-590C which is associated with image data approximating to the virtual image data 570C-570C and stored beforehand replaces the virtual image data 570A-570C in the 3D space 500 and is displayed as a moving image of real images.

Conclusion (1) As described above, the PC 6 which is the simulator according to the aforementioned embodiments is an apparatus provided with a control unit (for example, the CPU 901) that performs a simulation of a control program (for example, the control program 10, the control program 15) executed in a controller (for example, the controller 14) that controls motion of a machine (for example, the virtual conveyor 520, the virtual robots 530, 530A, 530B) that manipulates an object (for example, the virtual workpieces 540, 540A-540D).

The control unit includes a first calculator, a second calculator, a third calculator, and a virtual photographing part. The first calculator is a component that calculates a command value for moving a virtual machine (for example, the virtual conveyor 520, the virtual robots 530, 530A, and 530B in the 3D space 500) according to the control program and based on model data of a virtual object (for example, the workpiece in the 3D space) where the virtual machine corresponds to the machine which manipulates the object and the virtual object is manipulated by the virtual machine in a virtual space (for example, the 3D space 500) and corresponds to the object manipulated by the machine (for example, the component formed in the CPU 901 as a result of execution of step S313 and step S314 in FIG. 5).

The second calculator is a component that calculates motion of the virtual machine which is moved in accordance with the command value calculated by the first calculator (for example, the component formed in the CPU 901 as a result of execution of step S315 in FIG. 5).

The third calculator is a component that calculates motion of the virtual object which is moved in accordance with the motion of the virtual machine calculated by the second calculator (for example, the component formed in the CPU 901 as a result of execution of step S315 in FIG. 5).

The virtual photographing part is a component that generates an image of a predetermined photographing position which is acquired in the case where the motion of the virtual machine calculated by the second calculator or the motion of the virtual object calculated by the third calculator is virtually photographed (for example, the component formed in the CPU 901 as a result of execution of the virtual visual sensor 510 and step S115 in FIG. 5).

The first calculator calculates the command value further based on the virtual space image generated by the virtual photographing part (for example, in step S215, the position of the workpiece is recognized from the virtual image data 570 of the predetermined photographing position, and in step S313 and step S314, the machine is controlled and the command value for the machine is calculated based on the position of the workpiece).

As described above, the command value for moving the virtual machine is calculated according to the control program and based on the model data of the virtual object where the virtual machine corresponds to a machine which manipulates an object and the virtual object is manipulated by the virtual machine in a virtual space and corresponds to the object manipulated by the machine; motion of the virtual machine which is moved in accordance with the calculated command value is calculated; motion of the virtual object which is moved in accordance with the calculated motion of the virtual machine is calculated; a virtual space image is generated where the virtual space image is assumed to be acquired in the case where the calculated motion of the virtual machine or the calculated motion of the virtual object is virtually photographed; and the command value is calculated further based on the generated virtual space image.

As a result, the virtual machine in the virtual space corresponding to the machine in the real space is controlled on the basis of the virtual space image which is generated by the virtual photographing part and corresponds to the real space image photographed by the visual sensor in the real space. An integrated simulation of a machine system including a visual sensor in a real space corresponding to a virtual photographing part can be realized. Further, a test in the case where a visual sensor is used in machine control can be carried out.

(2) Further, the first calculator, the second calculator, the third calculator, and the virtual photographing part respectively calculate the command value, the motion of the virtual machine, and the motion of the virtual object and generate the virtual space image in accordance with the same time axis (for example, the machine control simulator, the 3D simulator, and the visual sensor simulator in FIG. 5 execute the respective loop processes by exchanging data with each other, therefore, the machine control simulator, the 3D simulator, and the visual sensor simulator are synchronized with each other based on the timing of the exchange and operate on the common time axis). As a result, a synchronized integrated simulation can be realized.

(3) Further, the control unit also includes a determination part and a fourth calculator. The determination part is a component that determines a condition of the object or the machine from the real space image photographed by the visual sensor in the real space corresponding to the virtual photographing part (for example, the component formed in the CPU 901 as a result of execution of step S103 in FIG. 8).

The fourth calculator is a component that calculates an initial condition of the object or the machine from the condition determined by the determination part (for example, the component formed in the CPU 901 as a result of execution of step S104 in FIG. 8).

The first calculator calculates the command value on the assumption that the initial condition calculated by the fourth calculator is a condition at a starting time of the simulation (for example, in step S311A in FIG. 8, an initial value is set, and in step S313 and step S314 in FIG. 5, the machine is controlled and the command value for the machine is calculated).

As a result, the situation in the real space can be reproduced. In case of an occurrence of a trouble, the situation on the occurrence of the trouble can be reproduced.

(4) Further, the simulator also includes a storage part (for example, the RAM 903, the HDD 904) and a display (for example, the monitor 907). The storage part includes an image storage part that associates the real space image photographed by the visual sensor in the real space corresponding to the virtual photographing part with the virtual space image corresponding to the real space image and stores the associated real space image and virtual space image beforehand (for example, a storage area in which the virtual image data 570 in the 3D space 500 and the corresponding real image data 590 in the real space are associated with each other and stored beforehand).

The control unit further includes a display controller. The display controller is a component that causes the display to display the real space image where the real space image is stored in the image storage part in association with the virtual space image generated by the virtual photographing part (for example, the component formed in the CPU 901 as a result of execution of step S121 and S122 in FIG. 11).

As a result, motion of an object or a machine in the virtual space can be displayed like an object or a machine in the real space.

Modification (1) As a simulation of machine control by using the real image data 590 photographed by the visual sensor in the real space, the aforementioned embodiments are adapted to perform the control of a virtual machine by using the virtual image data 570 from the virtual visual sensor 510 in the 3D space 500 which is a virtual space. In that case, the virtual visual sensor 510 is configured to photograph the virtual workpieces 540, 540A-540D which are virtual objects so that the virtual conveyor 520 and the virtual robots 530A and 530B as virtual machines are controlled based on the virtual image data 570 of the photographed virtual objects.

However, the present invention is not limited to that and the virtual visual sensor 510 is configured to photograph the virtual machines such as the virtual conveyor 520 or the virtual robots 530A and 530B so that the virtual machines are controlled based on the virtual image data 570 of the photographed virtual machines.

Alternatively, the virtual visual sensor 510 may be configured to photograph both of the virtual machines and the virtual objects so that the virtual machines are controlled based on the virtual image data 570 of the photographed virtual machines and virtual objects.

(2) The aforementioned embodiments describe the case where the simulator executed by the simulation part 806 is divided into three; the 3D simulator, the visual sensor simulator, and the machine control simulator.

However, the present invention is not limited to that and any two of the three simulators may be integrated into one simulator or the three simulators may be integrated into one simulator. Since that integration of the simulators saves the simulators the exchange of data with each other, the simulator can efficiently perform the simulations.

(3) The aforementioned embodiments describe the case where the virtual visual sensor 510 corresponding to the visual sensor which copes with the real image data 590 is used in the simulation. However, the present invention is not limited to that and any other sensor may be used if only the sensor can recognize the condition of the object or the machine: for example, an ultrasonic sensor, an optical sensor, an infrared sensor, a temperature sensor, or a displacement sensor may be used instead of limiting the sensor to a visual sensor.

(4) The aforementioned embodiments are described as an invention of a simulator. However, the present invention is not limited to that and may be understood as an invention of a simulation method performed in a simulator or as an invention of a simulation program executed in a simulator.

(5) The aforementioned third embodiment is adapted to cause the real image data 590, which is corresponding to image data approximating to the virtual image data 570 of a predetermined photographing position in the 3D space 500 corresponding to a position at which the visual sensor in the real space is aimed, to be read out from the HDD 904 in step S121 in FIG. 11 on the assumption that the virtual image data 570 in the 3D space 500 and the real image data 590 in the real space corresponding to the virtual image data 570 are associated with each other and stored beforehand.

However, the present invention is not limited to that and the real image data 590 photographed by the visual sensor in the real space may be saved in the HDD 904 as it is and the HDD 904 may be searched for the real image data 590 which is to be compared with the virtual image data 570 photographed by the virtual visual sensor 510 in real time when the simulation is performed. As the comparing method, the methods described with reference to FIG. 4 in the first embodiment may be used.

The embodiments disclosed herein are illustrative in all aspects and should not be construed as restrictive. The scope of the present invention is defined not by the above description but by the appended claims and all modifications within the equivalent meaning and scope of the appended claims are intended to be included in the invention.

DESCRIPTION OF SYMBOLS 2 server
4 network
8 controller support program
10, 15 control program
12 CD-ROM
14 controller
16 control target device
17 motor driver
18 motor
500 3D space
510 virtual visual sensor
520 virtual conveyor
530, 530A, 530B virtual robot
540, 540A-540D virtual workpiece
570, 570A-570C virtual image data
590, 590A-590C virtual image data
802 user interface part
804 display data creation part
806 simulation part
808 control program storage part
810 control program editor
812 controller interface part
901 CPU
902 ROM
903 RAM
904 HDD
905 keyboard
906 mouse
907 monitor
908 CD-ROM drive unit
909 communication IF
910 internal bus

The invention claimed is:

1. A simulator for reproducing, in a virtual space, a motion of a machine that is controlled by a control program to manipulate an object, wherein the simulator comprises a processor configured with a simulation program that causes the processor to perform operations comprising:
   determining a condition of the object from a real space image;
   calculating an initial position of a virtual object in the virtual space corresponding to the determined condition;
   calculating a command value for moving a virtual machine in the virtual space, according to the control program that controls the motion of the machine and based on the position of the virtual object manipulated by the virtual machine in the virtual space, wherein the virtual machine corresponds to the machine; and
   creating display data for displaying one of: a motion of the virtual machine and a motion of the virtual object that are moved in accordance with the calculated command value.

2. The simulator according to claim 1, wherein calculating the initial position of the virtual object comprises calculating the initial position of the virtual object by associating the real space image with a photographing position of a virtual photographing part corresponding to a visual sensor that photographs the object.

3. The simulator according to claim 1, wherein creating the display data comprises creating the display data for displaying the virtual object at the initial position.

4. The simulator according to claim 1, wherein
calculating the command value comprises calculating the command value, the motion of the virtual machine, and the motion of the virtual object in accordance with the same time axis, and
creating the display data comprises creating the display data for displaying the motion of the virtual machine and the motion of the virtual object.

5. The simulator according to claim 1, wherein the processor is configured with the simulation program to perform operations further comprising:
calculating a motion of the virtual machine in accordance with the calculated command value; and
calculating a motion of the virtual object that is moved by the calculated motion of the virtual machine, wherein
creating the display data comprises creating the display data for displaying one of: the calculated motion of the virtual machine and the calculated motion of the virtual object.

6. The simulator according to claim 1, further comprising a display, wherein
the processor is configured with the simulation program to perform operations further comprising displaying on the display an image based on the created display data.

7. A simulation method performed in a simulator comprising a processor configured with a simulation program that causes the processor to reproduce, in a virtual space, a motion of a machine that is controlled by a control program to manipulate an object, wherein
the method comprises:
determining, by the processor, a condition of the object from a real space image;
calculating, by the processor, an initial position of a virtual object in the virtual space corresponding to the determined condition;
calculating, by the processor, a command value for moving a virtual machine in the virtual space, according to the control program that controls the motion of the machine and based on the position of the virtual object manipulated by the virtual machine in the virtual space, wherein the virtual machine corresponds to the machine; and
creating, by the processor, display data for displaying one of: a motion of the virtual machine and a motion of the virtual object that are moved in accordance with the calculated command value.

8. The method according to claim 7, wherein calculating the initial position of the virtual object comprises calculating the initial position of the virtual object by associating the real space image with a photographing position of a virtual photographing part corresponding to a visual sensor that photographs the object.

9. The method according to claim 7, wherein creating the display data comprises creating the display data for displaying the virtual object at the initial position.

10. The method according to claim 7, wherein
calculating the command value comprises calculating the command value, the motion of the virtual machine, and the motion of the virtual object in accordance with the same time axis, and
creating the display data comprises creating the display data for displaying the motion of the virtual machine and the motion of the virtual object.

11. The method according to claim 7, further comprising:
calculating, by the processor, a motion of the virtual machine in accordance with the calculated command value; and
calculating, by the processor, a motion of the virtual object that is moved by the calculated motion of the virtual machine, wherein
creating the display data comprises creating the display data for displaying one of: the calculated motion of the virtual machine and the calculated motion of the virtual object.

12. The method according to claim 7, further comprising displaying, by a display, an image based on the created display data.

13. A non-transitory computer-readable medium having a simulation program stored thereon, the simulation program causing a simulator comprising a processor to reproduce, in a virtual space, a motion of a machine controlled by a control program to manipulate an object, the simulation program, when executed by the processor, causing the processor to perform operations comprising:
determining a condition of the object from a real space image;
calculating an initial position of a virtual object in the virtual space corresponding to the determined condition;
calculating a command value for moving a virtual machine in the virtual space, according to the control program that controls the motion of the machine and based on the position of the virtual object manipulated by the virtual machine in the virtual space, wherein the virtual machine corresponds to the machine; and
creating display data for displaying one of: a motion of the virtual machine and a motion of the virtual object that are moved in accordance with the calculated command value.

* * * * *